US011300626B2

(12) United States Patent
Wampler et al.

(10) Patent No.: US 11,300,626 B2
(45) Date of Patent: Apr. 12, 2022

(54) METHOD AND SYSTEM FOR BATTERY CAPACITY ESTIMATION

(71) Applicant: GM GLOBAL TECHNOLOGY OPERATIONS LLC, Detroit, MI (US)

(72) Inventors: Charles W. Wampler, Birmingham, MI (US); Alfred Zhang, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 177 days.

(21) Appl. No.: 16/743,839

(22) Filed: Jan. 15, 2020

(65) Prior Publication Data

US 2021/0215770 A1    Jul. 15, 2021

(51) Int. Cl.
*G01R 31/392* (2019.01)
*G01R 31/3828* (2019.01)
*G01R 31/374* (2019.01)
*G01R 31/3842* (2019.01)

(52) U.S. Cl.
CPC ......... *G01R 31/392* (2019.01); *G01R 31/374* (2019.01); *G01R 31/3828* (2019.01); *G01R 31/3842* (2019.01)

(58) Field of Classification Search
USPC ................................................ 324/426–435
See application file for complete search history.

(56) References Cited

U.S. PATENT DOCUMENTS

2016/0187432 A1*  6/2016  Saint-Marcoux .... G01R 31/392
                                                                  702/63

* cited by examiner

*Primary Examiner* — Vincent Q Nguyen
(74) *Attorney, Agent, or Firm* — Quinn IP Law

(57) ABSTRACT

A method for battery capacity estimation is provided. The method includes, within a computerized processor, monitoring a sensor operable to gather data regarding a battery, determining a voltage-based state of charge for the battery based upon the data from the sensor, determining a capacity degradation value for the battery based upon the data from the sensor, determining an integrated current value through Coulomb counting based upon the data from the sensor, determining a predicted battery state of charge for the battery based upon the capacity degradation value and the integrated current value, processing the voltage-based state of charge and the predicted battery state of charge using a Kalman filter to generate an updated overall battery capacity estimate, and using the updated overall battery capacity estimate to control management of the battery.

15 Claims, 3 Drawing Sheets

METHOD AND SYSTEM FOR BATTERY CAPACITY ESTIMATION

INTRODUCTION

The disclosure generally relates to a method and system for battery capacity estimation.

A battery is an electrochemical device that stores and delivers electrical energy to power devices. Batteries are employed on numerous devices, including hybrid or electric vehicles, cell phones, etc. Batteries are used to provide energy storage for a system. Batteries may be rechargeable. Battery capacity or battery charge capacity is a measure of how much charge is stored by the battery. As batteries are cyclically used to provide energy and are subsequently recharged, battery capacity may degrade.

SUMMARY

A method for battery capacity estimation is provided. The method includes, within a computerized processor, monitoring a sensor operable to gather data regarding a battery, determining a voltage-based state of charge for the battery based upon the data from the sensor, determining a capacity degradation value for the battery based upon the data from the sensor, determining an integrated current value through Coulomb counting based upon the data from the sensor, determining a predicted battery state of charge for the battery based upon the capacity degradation value and the integrated current value, processing the voltage-based state of charge and the predicted battery state of charge using a Kalman filter to generate an updated overall battery capacity estimate, and using the updated overall battery capacity estimate to control management of the battery.

In some embodiments, the method further includes, within the computerized processor, determining an uncertainty quantification for the voltage-based state of charge for the battery. In some embodiments, processing the voltage-based state of charge to the predicted battery state of charge using the Kalman filter includes utilizing the uncertainty quantification for the voltage-based state of charge to determine an effect of the voltage-based state of charge upon the updated overall battery capacity estimate.

In some embodiments, the method further includes, within the computerized processor, determining an uncertainty quantification for the predicted battery state of charge for the battery. In some embodiments, processing the voltage-based state of charge and the predicted battery state of charge using the Kalman filter includes utilizing the uncertainty quantification for the predicted battery state of charge to determine an effect of the predicted battery state of charge upon the updated overall battery capacity estimate.

In some embodiments, the method further includes, within the computerized processor, determining an uncertainty quantification for the voltage-based state of charge for the battery and determining an uncertainty quantification for the predicted battery state of charge for the battery. In some embodiments, processing the voltage-based state of charge to the predicted battery state of charge using the Kalman filter includes utilizing the uncertainty quantification for the voltage-based state of charge to determine an effect of the voltage-based state of charge upon the updated overall battery capacity estimate and utilizing the uncertainty quantification for the predicted battery state of charge to determine an effect of the predicted battery state of charge upon the updated overall battery capacity estimate.

In some embodiments, the method further includes, within the computerized processor, recursively processing updated values of the voltage-based state of charge and updated values of the predicted battery state of charge using the Kalman filter to generate successive values of the updated overall battery capacity estimate.

In some embodiments, the method further includes, within the computerized processor, utilizing a current value of the updated overall battery capacity estimate as a factor in determining a next value of the voltage-based state of charge.

In some embodiments, the method further includes, within the computerized processor, utilizing a current value of the updated overall battery capacity estimate as a factor in determining a next value of the predicted battery state of charge.

In some embodiments, the method further includes, within the computerized processor, utilizing the data from the sensor to perform battery state estimation, and the voltage-based state of charge is determined further based upon the battery state estimation.

In some embodiments, the battery state estimation includes the Coulomb counting.

In some embodiments, monitoring the sensor includes monitoring a temperature sensor operable to monitor a temperature of the battery, monitoring a current sensor operable to monitor electrical current provided by the battery, and monitoring a voltage sensor operable to monitor a voltage of the battery.

According to an alternative embodiment, a method for battery capacity estimation is provided. The method includes, within a computerized processor, monitoring a temperature sensor operable to monitor a temperature of a battery, monitoring a current sensor operable to monitor electrical current provided by the battery, and monitoring a voltage sensor operable to monitor a voltage of the battery. The method further includes determining a voltage-based state of charge for the battery based upon the voltage of the battery, determining a capacity degradation value for the battery based upon data from the temperature sensor, the current sensor, and the voltage sensor, determining an integrated current value through Coulomb counting based upon the data from the current sensor, and determining a predicted battery state of charge for the battery based upon the capacity degradation value and the integrated current value. The method further includes processing the voltage-based state of charge and the predicted battery state of charge using a Kalman filter to generate an updated overall battery capacity estimate, using the updated overall battery capacity estimate to control management of the battery, and recursively processing updated values of the voltage-based state of charge and updated values of the predicted battery state of charge using the Kalman filter to generate successive values of the updated overall battery capacity estimate.

In some embodiments, the method further includes, within the computerized processor, determining an uncertainty quantification for the voltage-based state of charge for the battery. In some embodiments, processing the voltage-based state of charge to the predicted battery state of charge using the Kalman filter includes utilizing the uncertainty quantification for the voltage-based state of charge to determine an effect of the voltage-based state of charge upon the updated overall battery capacity estimate.

In some embodiments, the method further includes, within the computerized processor, determining an uncertainty quantification for the predicted battery state of charge for the battery. In some embodiments, processing the voltage-based state of charge and the predicted battery state of charge using the Kalman filter includes utilizing the uncertainty quantification for the predicted battery state of charge to determine an effect of the predicted battery state of charge upon the updated overall battery capacity estimate.

In some embodiments, the method further includes, within the computerized processor, utilizing a current value of the updated overall battery capacity estimate as a factor in determining a next value of the voltage-based state of charge.

In some embodiments, the method further includes, within the computerized processor, utilizing a current value of the updated overall battery capacity estimate as a factor in determining a next value of the predicted battery state of charge.

In some embodiments, the method further includes, within the computerized processor, utilizing the data from the sensor to perform battery state estimation, and the voltage-based state of charge is determined further based upon the battery state estimation.

In some embodiments, the battery state estimation includes the Coulomb counting.

According to an alternative embodiment, a system for battery capacity estimation is provided. The system includes a battery and a sensor operable to gather information regarding the battery. The system further includes a computerized battery capacity estimation controller programmed to monitor data from the sensor, determine a voltage-based state of charge for the battery based upon the data from the sensor, determine a capacity degradation value for the battery based upon the data from the sensor, determine an integrated current value through Coulomb counting based upon the data from the sensor, determine a predicted battery state of charge for the battery based upon the capacity degradation value and the integrated current value, and process the voltage-based state of charge and the predicted battery state of charge using a Kalman filter to generate an updated overall battery capacity estimate. The system further includes a computerized battery maintenance controller programmed to use the updated overall battery capacity estimate to control management of the battery.

In some embodiments, the computerized battery capacity estimation controller is further programmed to determine an uncertainty quantification for the voltage-based state of charge for the battery, determine an uncertainty quantification for the predicted battery state of charge for the battery. In some embodiments, programming to process the voltage-based state of charge to the predicted battery state of charge using the Kalman filter includes programming to utilize the uncertainty quantification for the voltage-based state of charge to determine an effect of the voltage-based state of charge upon the updated overall battery capacity estimate and utilize the uncertainty quantification for the predicted battery state of charge to determine an effect of the predicted battery state of charge upon the updated overall battery capacity estimate.

In some embodiments, the computerized battery capacity estimation controller is further programmed to recursively process updated values of the voltage-based state of charge and updated values of the predicted battery state of charge using the Kalman filter to generate successive values of the updated overall battery capacity estimate.

The above features and advantages and other features and advantages of the present disclosure are readily apparent from the following detailed description of the best modes for carrying out the disclosure when taken in connection with the accompanying drawings.

DETAILED DESCRIPTION

Figure 1:
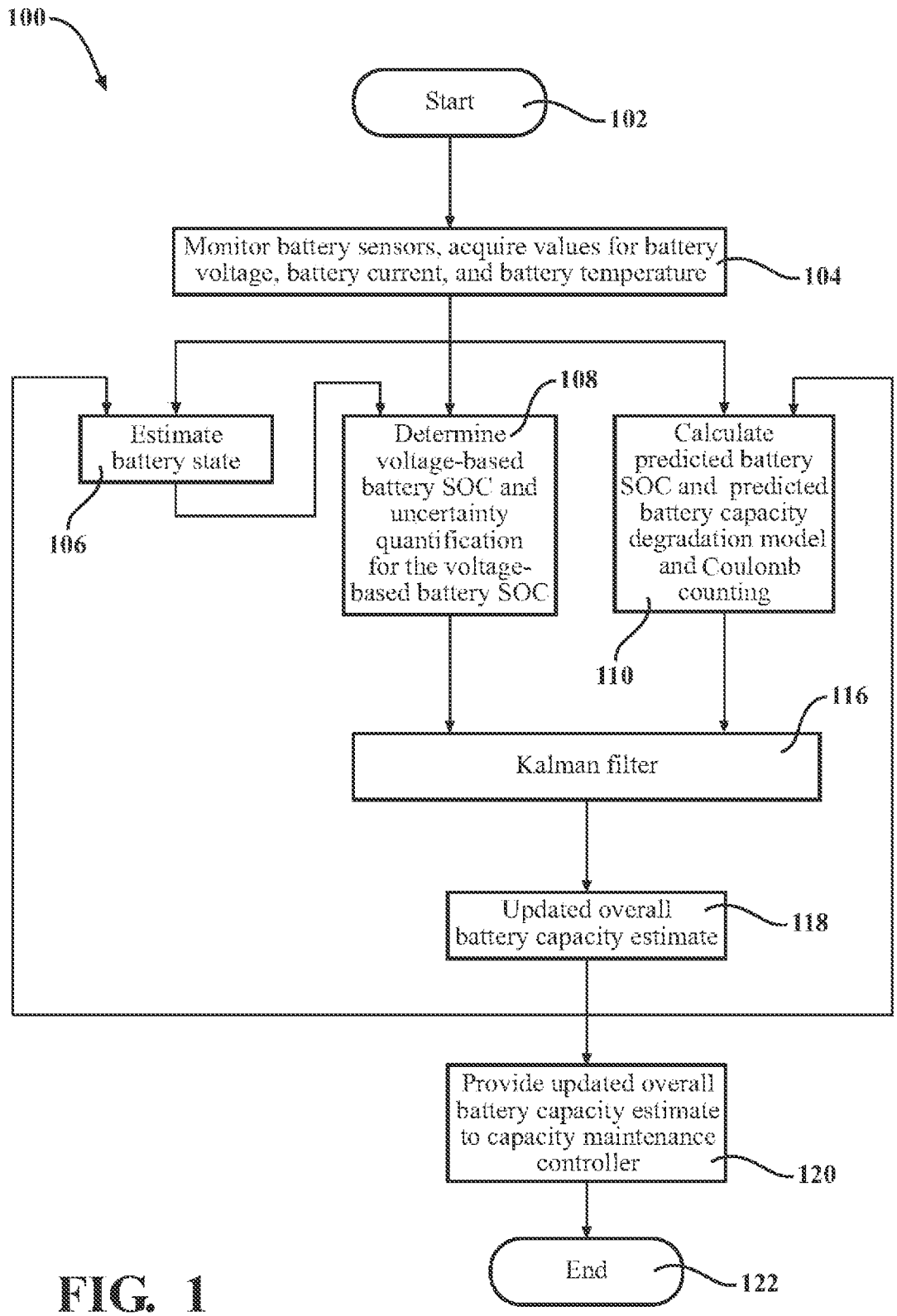
FIG. 1 is a flowchart illustrating a method for battery capacity estimation, in accordance with the present disclosure.

Battery capacity estimation methods in the art may produce noisy, inaccurate results. Further battery capacity estimation methods in the art may rely upon waiting for voltage measurement values to accumulate and to generate a battery capacity estimation. This dependency upon an accumulation of historical values creates a lag in the resulting battery capacity estimation. In one embodiment, values of historical data are given equal weight.

A method is provided to estimate uncertainty in a voltage-based state of charge measurement and a corresponding Coulomb count and contemporaneously determines a battery capacity. The provided method reduces lag in the estimate and may reduce noise in the measurement. Lag in the capacity estimate may be further reduced by determining/diagnosing a trendline in capacity degradation. In one embodiment, the method is recursive, constantly determining a battery capacity update and an uncertainty update. The resulting determination is useful for tracking battery capacity as it degrades with time and usage, for applications including electric and hybrid-electric vehicles.

By accounting for sensitivity to noise factors and correlations thereof, capacity degradation and its trendline are detected with reduced variation. In one embodiment, values that may be flagged as more reliable data may be emphasized or relied upon. For example, voltage values measured while a battery is at rest may be more accurate than voltage values measured while the battery is supplying energy to an associated electrical circuit. In another example, the accuracy of battery state of charge estimates provided continuously by a closed-loop battery state estimator may vary over time in response to varying conditions of temperature, current, and state of charge come into play.

By accounting for sensitivity to noise factors and correlations thereof, capacity degradation and its trendline are detected with reduced variation. Moreover, the approach estimates its own accuracy, which allows other algorithms that depend on capacity to make better estimates and decisions.

The provided method, in one embodiment, monitors time-based measurements of a battery voltage, a battery current, and a battery temperature. Using these monitored values, the method predicts changes in battery capacity (or the reciprocal) a battery state of charge based upon the battery current, and an uncertainty quantification related to the current-based battery state of charge estimation. The method determines a second state of charge estimate based upon battery voltage and an uncertainty quantification related to the voltage-based battery state of charge estimation, and then compares the two state of charge estimates. Taking both of the uncertainty quantifications into account, a Kalman filter feedback determination adjusts an updated overall battery capacity estimate. In one embodiment, the Kalman filter feedback determination further adjusts an updated battery capacity degradation estimate and additionally provides an updated overall uncertainty quantification.

Referring now to the drawings, wherein like reference numbers refer to like features throughout the several views, FIG. 1 is a flowchart illustrating a method 100 for battery capacity estimation which may be executed within a computerized controller. Method 100 starts at step 102. At step 104, battery sensors are monitored and values for battery voltage, battery current, and battery temperature are acquired. At step 106, a battery state is estimated. At step 108, a voltage-based battery state of charge is determined based upon the battery state estimated at step 106 and the monitored battery voltage. The voltage-based battery state of charge may in some embodiments be described as a measured state of charge. At step 108, additionally, an uncertainty quantification for the voltage-based battery state of charge may be determined. At step 110, a capacity degradation model and a coulomb counting calculation are operated using sensor data as inputs, where a predicted battery state of charge and a predicted battery capacity are calculated. At step 116, outputs from step 108 and 110 are input and a Kalman filter is utilized. Output from the Kalman filter is provided as an updated overall battery capacity estimate at step 118. The updated overall battery capacity estimate is provided at step 120 to a capacity maintenance controller for use in controlling the battery and an associated electrical system. Additionally, the updated overall battery capacity estimate is provided to subsequent cycles at steps 106 and 110 to improve state of charge determinations/predictions. Method 100 is illustrated ending at step 122, although the method steps are recursive, with cyclical or constant updates being performed to create new updated overall battery capacity estimate values. Method 100 is exemplary, a number of alternative methods are envisioned, and the disclosure is not intended to be limited to the particular examples provided herein.

Step 110 of FIG. 1 includes a Coulomb counting calculation. In another embodiment, such a Coulomb counting calculation or determination may instead be performed in step 106 as part of battery state estimation and propagated through the rest of the method.

Figure 2:
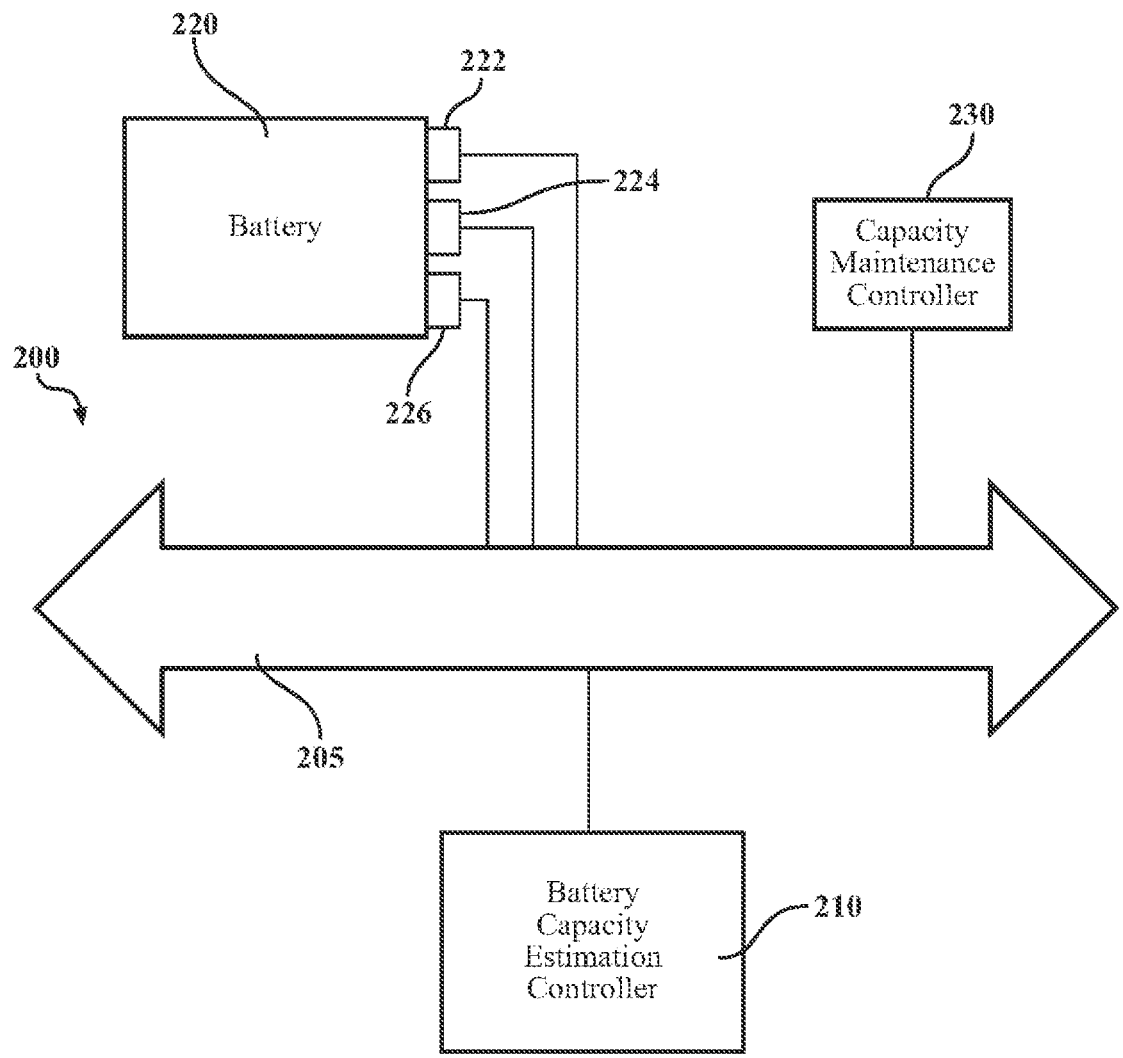
FIG. 2 schematically illustrates a system communication architecture 200 operable to transmit data between devices, sensors, controllers and other electronic devices in the system, in accordance with the present disclosure.

FIG. 2 schematically illustrates a system communication architecture 200 operable to transmit data between devices, sensors, controllers and other electronic devices in the system. System communication architecture 200 includes communications bus 205 configured to provide an ability for devices, sensors, controllers and other electronic devices in the system to electronically communicate. Components to system communication architecture 200 may be described as a system enabled to operate the provided method 100.

Computerized battery capacity estimation controller 210 is illustrated communicably connected to communications bus 205. Battery capacity estimation controller 210 is a computerized device including a computerized processor, random access memory, and a durable memory storage device and is operable to execute programming. Battery capacity estimation controller 210 may be programmed to operate the method 100 of FIG. 1 or a similar method.

Battery 220 is illustrated communicably connected to communications bus 205. One battery or a plurality of batteries may be present and connected to the communications bus 205. Battery 220 includes a device operable to store, receive, and selectively provide electrical energy. The battery 220 may be a lithium-polymer device or another rechargeable electrochemical configuration that is arranged to supply electric power, may include a single battery cell or multiple linked battery cells, and may supply direct current electrical power. Battery 220 may include electronic circuitry operable to provide and receive data through communications bus 205. A battery temperature sensor 222, a battery voltage sensor 224, and a battery current sensor 226 are illustrated connected to the battery 220. Each of the battery temperature sensor 222, the battery voltage sensor 224, and the battery current sensor 226 may be communicably connected to the communications bus 205, for example, providing data to the battery capacity estimation controller 210 through the communications bus 205.

The capacity maintenance controller 230 is illustrated communicably connected to communications bus 205. The capacity maintenance controller 230 is a computerized device including a computerized processor, random access memory, and a durable memory storage device and is operable to execute programming. The capacity maintenance controller 230 receives battery capacity estimations from the provided method and may be programmed to operate processes related to operating and managing the battery 220 and the associated electrical system. The capacity maintenance controller 230 may include programming useful to manage charging and discharging cycles with increase efficiency in light of the provided battery capacity estimations; to provide timely and more accurate alerts to a user or owner of the battery to estimate when maintenance and/or replacement of the battery is required; and to provide improved range estimates or remaining charge estimates for the battery to enable an increased ability to rely upon the battery for a particular duration. Additionally, the capacity maintenance controller may adjust charge and discharge voltage and current limits, such that the battery is protected from excessive wear and tear. This reduces warranty costs and provides a more consistent drive experience for the customer.

Figure 3:
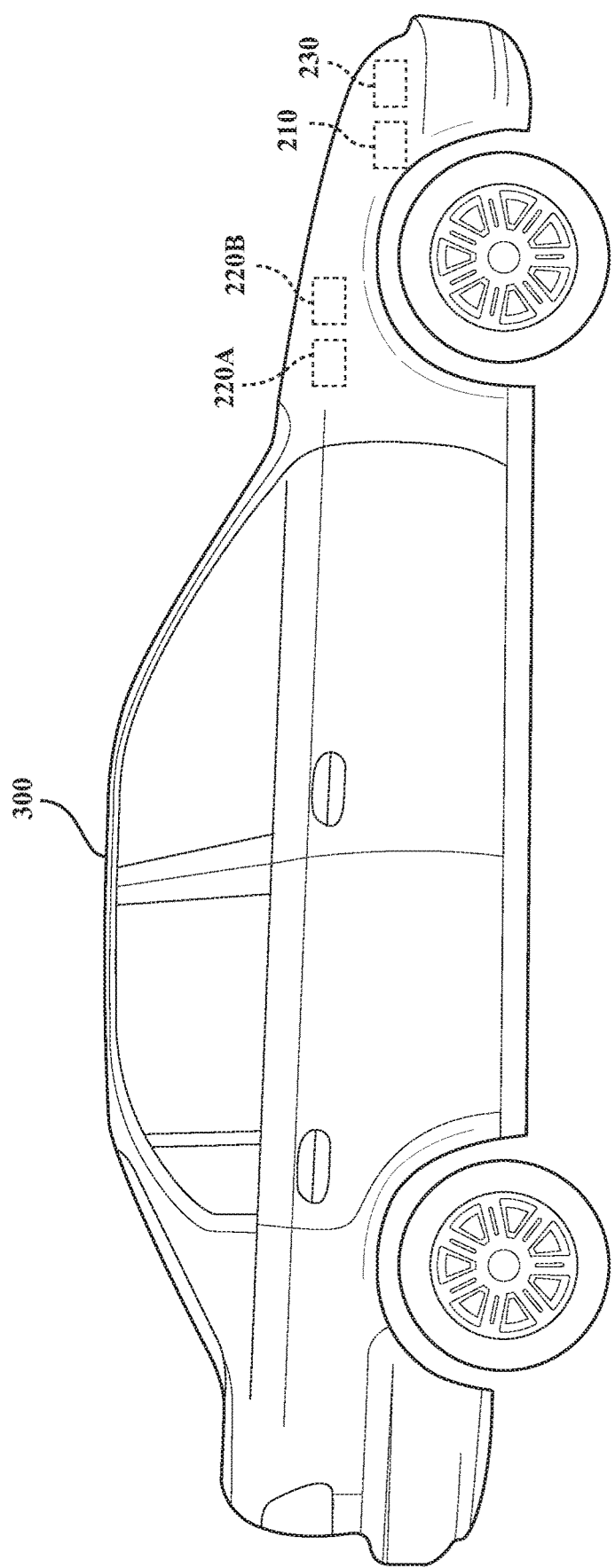
FIG. 3 schematically illustrates an exemplary vehicle including a battery estimation controller, a pair of batteries, and a capacity maintenance controller, in accordance with the present disclosure.

The provided method 100 can be utilized in a wide variety of systems employing battery energy storage and utilization. One exemplary system in which the method may be utilized is a vehicular system utilizing one or more batteries to store and provide energy to electric machines using electrical energy to supply an output torque, electrical actuators, or other similar devices. FIG. 3 schematically illustrates an exemplary vehicle 300 including a battery capacity estimation controller 210, a first battery 220A, a second battery 220B, and a capacity maintenance controller 230. In accordance with the provided method, battery capacity estimation controller 210 may include programming to estimate a capacity of each of the first battery 220A and the second battery 220B.

An exemplary determination of estimated battery capacity follows. Rested voltages $V_0, \ldots, V_N$ and Coulomb counts between rests of $\Delta Ah_1, \ldots, \Delta Ah_N$ may be measured. An initial estimate of capacity may be defined as follows:

$$C_0 = Cap_{ref} \quad [1]$$

An open circuit voltage curve may be referenced for a battery that relates state of charge to voltage and is invertible. $s_i$ may be defined for the state of charge at rest i. The open circuit voltage curve reads $v = U(s)$ and its inverse is $s = U^{-1}(v)$.

A vector format may be defined as follows. Let $V = [V_0 \ldots V_N]^T$ be the vector of measured voltages. Let $s = [s_0 \ldots s_N]^T$ be the vector of SOCs. An exact state of charge may not be able to be directly determined, but $U^{-1}(V)$ approximates such a value. Let $y = (1/Cap_{ref})[\Delta Ah_1 \ldots \Delta Ah_N]T$ be the vector of scaled Coulomb counts.

A basic model may be defined as follows:

$$\Delta Ah_k = Cap \cdot (s_k - s_{k-1}), k=1, \ldots, N \quad [2]$$

which may be rewritten as follows:

$$y = mDs \quad [3]$$

where $m := Cap/Cap_{ref}$ and D is the (sparse) forward differencing matrix.

An objective may be defined to estimate m and quantify the uncertainty in that estimate. A second objective may be defined to estimate the vector of states of charge, s. In some instances, a determination of s may not be required.

A noise model may be defined as follows. In one embodiment, noises may be assumed to include zero-mean, independent, Gaussian distributions. The initial estimate of m is $\hat{m}=1$ assumed accurate to standard deviation $\sigma_{m0}$. The voltage measurements have noise distributed as $N(0, \Sigma_V)$, where, assuming that every voltage measurement has the same accuracy, $\Sigma_V = \sigma_V^2 I$. Each Coulomb count, $\Delta Ah_k$, has an error independent of the others, but not necessarily the same variance. Covariance of the error in y may be defined as follows:

$$\Sigma_y = \left(\frac{1}{Cap_{ref}^2}\right) \text{diag}\left(\ldots, \sigma_{Ah_k}^2, \ldots\right) \quad [4]$$

Incremental estimation by a Kalman filter may be defined as follows. In an instance where a determination of the full vector s is not required, an estimate of $s_k$ may be produced using data for times $i \leq k$ and also estimate m at that time. Then, when measurements ($\Delta Ah_{k+1}, V_{k+1}$) arrive, an estimate of $s_{k+1}$ and a new estimate of m may be determined.

When a model is linear, as is the one that follows, the standard Kalman filter may produce accurate estimates. For this formulation, the following may be defined as follows:

$$q = \frac{1}{m} = \frac{Cap_{ref}}{Cap}, \quad [5]$$

so, the basic model becomes as follows:

$$qy = Ds \quad [6]$$

The state at time k has two entries as follows:

$$x_k = \begin{bmatrix} q_k \\ s_k \end{bmatrix} \quad [7]$$

A state transition equation may be defined as follows:

$$x_{k+1} = \quad [8]$$
$$x_k + \begin{bmatrix} 0 \\ q_k y_k \end{bmatrix} + \begin{bmatrix} 1 & 0 \\ 0 & q_k \end{bmatrix} \xi_k = \begin{bmatrix} 1 & 0 \\ y_k & 1 \end{bmatrix} x_k + \begin{bmatrix} 1 & 0 \\ 0 & q_k \end{bmatrix} \xi_k = F_k x_k + G_k \xi_k$$

where $\xi_k$ is a noise factor distributed as follows:

$$\xi_k \sim N\left(0, \begin{bmatrix} \sigma_{wk}^2 & 0 \\ 0 & \Sigma_{yk} \end{bmatrix}\right) \quad [9]$$

and each $\xi_k$ is independent of $\xi_j$, $j \neq k$. The covariance entry $\sigma_{wk}^2$ models a random walk that allows q to vary with time, which may be made proportional to the actual time between samples k and k+1 or may be proportional to the amp-hour throughput between the samples.

A measurement equation may be defined as follows:

$$z_k = s_k = \xi_k = H x_k + \xi_k, H = [0 \ 1] \quad [10]$$

where $\xi_k$ is a noise factor distributed as follows:

$$\xi_k \sim N\left(0, \left(\frac{\sigma_V}{U'(s_k)}\right)^2\right) = N(0, \sigma_{sk}^2), U' = \frac{dU}{ds}. \quad [11]$$

$\hat{x}_{k|j}$ is an estimate of $x_k$ given the measurements up to time $j \leq k$. The covariance of the error in this estimate may be defined as follows:

$$P_{k|j} = \text{cov}(\hat{x}_{k|j} - x_k) \quad [12]$$

The measurements are the rested voltages converted to SOC. The innovations of the model (i.e., the difference between the measured $z_k$ and the value predicted from our estimates), may be defined as follows:

$$\tilde{z}_k = U^{-1}(V_k) - \hat{s}_{k|k-1} \quad [13]$$

A determination begins at time 0 with an initial estimate as follows:

$$\hat{x}_{0|0} = \begin{bmatrix} 1 \\ s_0 \end{bmatrix}, P_{0|0} = \begin{bmatrix} \sigma_{q0}^2 & 0 \\ 0 & \sigma_{s0}^2 \end{bmatrix}. \quad [14]$$

This is a linear Kalman filtering problem ready for application of the standard uncorrelated time update followed by measurement update. In the described embodiment, the matrix math is size 2×2 and the inverse that appears is s scalar, i.e., $M_k^{-1} = 1/M_k$, because there is just one measurement.

In practice, in an actual usage, it might happen that some $\Delta Ah_k$ is corrupted or missing. That breaks the chain linking $x_{k-1}$ to $x_k$. In such an instance, a restart may be achieved as follows:

$$\hat{x}_{k|k} = \begin{bmatrix} \hat{q}_{k-1|k-1} \\ s_k \end{bmatrix}, P_{k|k} = \begin{bmatrix} P_{k-1|k-1}(1,1) + \sigma_{wk-1}^2 & 0 \\ 0 & \sigma_{sk}^2 \end{bmatrix}. \quad [15]$$

A capacity degradation trend may be estimated or determined as follows. Instead of assuming that the capacity has an unbiased random walk, a trend may be estimated. This approach modifies the state transition model and adds another state to it. For example, if it is assumed that capacity degrades proportional to a power, γ, of amp-hour throughput, as follows:

$$\Delta Ah_{thru} = \int_{t_k}^{t_{k+1}} |I| dt > 0, \quad [16]$$

the following can be provided as follows:

$$q_{k+1} = q_k + p_k \Delta Ah_{thru,k}^\gamma + \text{noise}_q \quad [17]$$

$$p_{k+1} = p_k + \text{noise}_p \quad [18]$$

$$s_{k+1} = s_k + q_k y_k + q_k \cdot \text{noise}_y \quad [19]$$

Since q is the reciprocal of scaled capacity, it may grow with time, so $p_k$ may be greater than 0. The filter might be constrained to enforce that sign. The exponent y may be determined from life testing in the lab and not try to do that on-board the vehicle.

The noise factors $noise_q$, $noise_p$ may be associated with random behavior in q and p. This has the effect of gradually forgetting old data. Since most of the change in q should be accounted for by the trend term, the variance of $noise_q$ should be smaller than the value of $\sigma w k^2$ as used for the previous formulation. The factor $noise_y$ has variance $\sigma_{Ahk}^2/Cap_{ref}^2$, as before. This is a linear model, although now the matrix math is size 3×3. $M_k$ is a scalar. The Kalman filter formalism may be applied to this new problem, using variances given for $noise_q$, $noise_p$, $noise_y$.

It is noted that some battery cells/packs may have a larger initial capacity than the nominal specification. This means that q will temporarily decrease at first as the method corrects toward the correct value. After that it will get on the degradation trend line and increase thereafter. Due to noise in the measurements, it is possible that the estimate will make the estimated increase in q too big on one step and need to correct that with a decrease later. According to one embodiment, the method would not rigidly force q to increase. In some embodiments, however, the method may include a measure to force the estimate of p to be nonnegative.

There are several options for integrating the foregoing capacity estimation with battery state estimation. First, in an option defined as true rests, the capacity updates occur when the battery has rested sufficient time to be in (near) thermodynamic equilibrium, for example, at a restart time when the vehicle has been turned off for 1 hour or more. The voltage v is measured before drawing significant current and converted to state of charge (SOC) as $s=U^{-1}(v)$. Second, in an option defined as voltage-based battery state estimation, an existing battery state estimation estimates the open-circuit voltage, $V_{OC}$, at every time step. This is the equilibrium voltage that the battery would be expected to settle to if allowed to rest. With this battery state estimation in place, $s=U^{-1}(V_{OC})$ may be used to update capacity at every time step. The quantity $s=U^{-1}(V_{OC})$ may be defined as $SOC_V$. Third, in an option defined as state of charge tracking battery state estimation, in future battery state estimation implementations, one of the states is already state of charge and one of the state transition equations is as follows:

$$s_{k+1}=s_k+q_k v_k+q_k \cdot noise_y \quad [20]$$

enabling adding $q_k$ as a state to the Kalman filter formulation.

The aforementioned equations and algorithms provide one exemplary embodiment for accomplishing the described battery state estimation. These equations and algorithms may be programmed into a battery state estimation controller and used according to the described processes and method. A number of alternative embodiments are envisioned, and the disclosure is not intended to be limited to the examples provided herein.

While the best modes for carrying out the disclosure have been described in detail, those familiar with the art to which this disclosure relates will recognize various alternative designs and embodiments for practicing the disclosure within the scope of the appended claims.

What is claimed is:

1. A method for battery capacity estimation, comprising:
within a computerized processor:
monitoring a sensor operable to gather data regarding a battery;
determining a voltage-based state of charge for the battery based upon the data from the sensor;
determining a capacity degradation value for the battery based upon the data from the sensor;
determining an integrated current value through Coulomb counting based upon the data from the sensor;
determining a predicted battery state of charge for the battery based upon the capacity degradation value and the integrated current value;
determining an uncertainty quantification for the voltage-based state of charge for the battery;
processing the voltage-based state of charge and the predicted battery state of charge using a Kalman filter to generate an updated overall battery capacity estimate; and
using the updated overall battery capacity estimate to control management of the battery; and
wherein processing the voltage-based state of charge to the predicted battery state of charge using the Kalman filter includes utilizing the uncertainty quantification for the voltage-based state of charge to determine an effect of the voltage-based state of charge upon the updated overall battery capacity estimate.

2. The method of claim 1, further comprising, within the computerized processor, recursively processing updated values of the voltage-based state of charge and updated values of the predicted battery state of charge using the Kalman filter to generate successive values of the updated overall battery capacity estimate.

3. The method of claim 1, further comprising, within the computerized processor, utilizing a current value of the updated overall battery capacity estimate as a factor in determining a next value of the voltage-based state of charge.

4. The method of claim 1, further comprising, within the computerized processor, utilizing a current value of the updated overall battery capacity estimate as a factor in determining a next value of the predicted battery state of charge.

5. The method of claim 1, further comprising, within the computerized processor, utilizing the data from the sensor to perform battery state estimation; and
wherein the voltage-based state of charge is determined further based upon the battery state estimation.

6. The method of claim 5, wherein performing the battery state estimation includes performing the Coulomb counting.

7. The method of claim 1, wherein monitoring the sensor includes:
monitoring a temperature sensor operable to monitor a temperature of the battery;
monitoring a current sensor operable to monitor electrical current provided by the battery; and
monitoring a voltage sensor operable to monitor a voltage of the battery.

8. A method for battery capacity estimation, comprising:
within a computerized processor:
monitoring a sensor operable to gather data regarding a battery;
determining a voltage-based state of charge for the battery based upon the data from the sensor;
determining a capacity degradation value for the battery based upon the data from the sensor;
determining an integrated current value through Coulomb counting based upon the data from the sensor;
determining a predicted battery state of charge for the battery based upon the capacity degradation value and the integrated current value;

determining an uncertainty quantification for the predicted battery state of charge for the battery;

processing the voltage-based state of charge and the predicted battery state of charge using a Kalman filter to generate an updated overall battery capacity estimate; and using the updated overall battery capacity estimate to control management of the battery; and wherein processing the voltage-based state of charge and the predicted battery state of charge using the Kalman filter includes utilizing the uncertainty quantification for the predicted battery state of charge to determine an effect of the predicted battery state of charge upon the updated overall battery capacity estimate.

9. The method of claim 8, further comprising, within the computerized processor, recursively processing updated values of the voltage-based state of charge and updated values of the predicted battery state of charge using the Kalman filter to generate successive values of the updated overall battery capacity estimate.

10. The method of claim 8, further comprising, within the computerized processor, utilizing a current value of the updated overall battery capacity estimate as a factor in determining a next value of the voltage-based state of charge.

11. The method of claim 8, further comprising, within the computerized processor, utilizing a current value of the updated overall battery capacity estimate as a factor in determining a next value of the predicted battery state of charge.

12. The method of claim 8, further comprising, within the computerized processor, utilizing the data from the sensor to perform battery state estimation; and wherein the voltage-based state of charge is determined further based upon the battery state estimation.

13. The method of claim 12, wherein performing the battery state estimation includes performing the Coulomb counting.

14. The method of claim 8, wherein monitoring the sensor includes:

monitoring a temperature sensor operable to monitor a temperature of the battery;

monitoring a current sensor operable to monitor electrical current provided by the battery; and monitoring a voltage sensor operable to monitor a voltage of the battery.

15. A method for battery capacity estimation, comprising: within a computerized processor:

monitoring a sensor operable to gather data regarding a battery;

determining a voltage-based state of charge for the battery based upon the data from the sensor;

determining a capacity degradation value for the battery based upon the data from the sensor;

determining an integrated current value through Coulomb counting based upon the data from the sensor;

determining a predicted battery state of charge for the battery based upon the capacity degradation value and the integrated current value;

determining an uncertainty quantification for the voltage-based state of charge for the battery;

determining an uncertainty quantification for the predicted battery state of charge for the battery;

processing the voltage-based state of charge and the predicted battery state of charge using a Kalman filter to generate an updated overall battery capacity estimate; and using the updated overall battery capacity estimate to control management of the battery; and wherein processing the voltage-based state of charge to the predicted battery state of charge using the Kalman filter includes:

utilizing the uncertainty quantification for the voltage-based state of charge to determine an effect of the voltage-based state of charge upon the updated overall battery capacity estimate; and utilizing the uncertainty quantification for the predicted battery state of charge to determine an effect of the predicted battery state of charge upon the updated overall battery capacity estimate.

* * * * *